(12) United States Patent
Pendharkar et al.

(10) Patent No.: US 7,943,472 B2
(45) Date of Patent: May 17, 2011

(54) COSI2 SCHOTTKY DIODE INTEGRATION IN BISMOS PROCESS

(75) Inventors: Sameer Pendharkar, Allen, TX (US); Eugen Pompiliu Mindricelu, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 605 days.

(21) Appl. No.: 12/023,190

(22) Filed: Jan. 31, 2008

(65) Prior Publication Data

US 2009/0194838 A1    Aug. 6, 2009

(51) Int. Cl.
*H01L 21/329* (2006.01)
*H01L 21/20* (2006.01)

(52) U.S. Cl. ........ 438/379; 438/237; 438/238; 438/414; 438/473; 438/570; 257/471; 257/476; 257/E21.351; 257/E21.352; 257/E21.359; 257/E21.04

(58) Field of Classification Search .................. 438/237, 438/238, 379, 414, 473, 570; 257/471, 476, 257/E21.251, E21.352, E21.359, E21.04

See application file for complete search history.

(56) References Cited

U.S. PATENT DOCUMENTS

| 6,882,029 B1 * | 4/2005 | Gau et al. ........................ 257/595 |
| 6,949,440 B2 * | 9/2005 | Gau ................................. 438/379 |
| 2010/0279483 A1 * | 11/2010 | Collins et al. .................. 438/379 |

* cited by examiner

*Primary Examiner* — Dao H Nguyen
(74) *Attorney, Agent, or Firm* — Warren L. Franz; Wade J. Brady, III; Frederick J. Telecky, Jr.

(57) ABSTRACT

Cobalt silicide (CoSi2) Schottky diodes fabricated per the current art suffer from excess leakage currents in reverse bias. In this invention, an floating p-type region encircles each anode of a CoSi2 Schottky diode comprising of one or more CoSi2 anodes. The resulting p-n junction forms a depletion region under the Schottky junction that reduces leakage current through the Schottky diodes in reverse bias operation.

13 Claims, 6 Drawing Sheets

US 7,943,472 B2

COSI2 SCHOTTKY DIODE INTEGRATION IN BISMOS PROCESS

FIELD OF THE INVENTION

This invention relates to the field of integrated circuits. More particularly, this invention relates to integrated circuits using cobalt silicide (CoSi2) on silicon Schottky diodes.

BACKGROUND OF THE INVENTION

Schottky diodes are used in electronic circuits to provide low voltage drops in forward biased operation and low leakage currents in reverse biased operation. The current art integrates cobalt silicide on silicon Schottky diodes into the BiC-MOS fabrication process. Cobalt silicide Schottky diodes are fabricated by forming cobalt silicide in a region on the surface of a lightly doped n-type silicon layer. The current-voltage relationship of current art CoSi2 Schottky diodes is degraded by generation-recombination sites in the silicon under the Schottky junction. The current art Schottky diodes exhibit higher leakage current in reverse bias operation than comparable diodes with no generation-recombination sites. Leakage current in reverse bias operation is undesirable in most circuit applications.

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An integrated circuit diode is formed of an n-type cathode, metal silicide anode, and a floating p-type region encircling the anode. A plurality of such diodes with similar surrounding p-type regions may be connected in parallel to increase current carrying capacity. The p-type region comprised by this invention can be incorporated into an integrated circuit without adding additional steps to the fabrication process.

DETAILED DESCRIPTION

Figure 1:
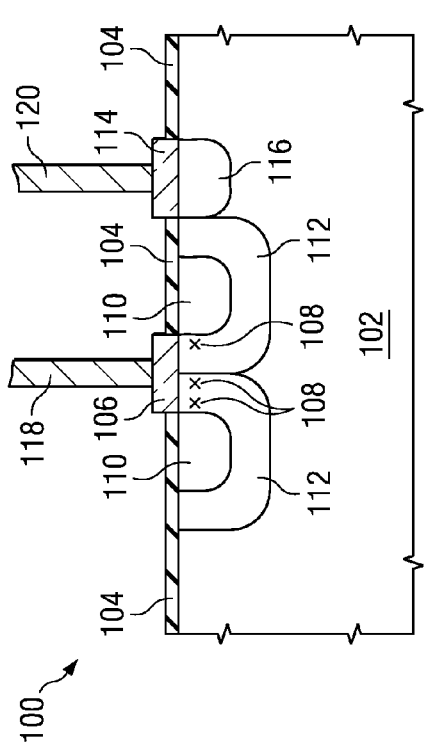
FIG. 1 is a fragmentary, diagrammatic sectional view on an enlarged scale of an integrated circuit diode comprising a single anode, a single cathode and a p-type region encircling the anode according to an embodiment of the instant invention.

FIG. 1 is a fragmentary, diagrammatic sectional view on an enlarged scale of an integrated circuit diode comprising a single anode, a single cathode and a p-type region encircling the anode according to an embodiment of the instant invention. An integrated circuit (100) contains an n-type region (102). A silicide block dielectric layer (104), typically comprising silicon nitride, is formed on a surface of the n-type region (102), and patterned to define regions for metal silicide formation in a later process step. An integrated circuit diode of this invention is fabricated in the integrated circuit (100) by forming a cobalt silicide (CoSi2) region (106) in a region of the n-type region (102) defined by an opening in the dielectric layer (104). The CoSi2 region (106) comprises an anode of the integrated circuit diode of this invention, and the n-type region adjacent to the CoSi2 region (106) comprises a cathode of the diode, also known as a Schottky diode. Forming CoSi2 in the anode region generates sites (108) in the cathode region that generate leakage current when the diode is operated in reverse bias. In a first embodiment of this invention, a p-type region (110) is formed in the integrated circuit substrate to encircle the anode. In another embodiment, the p-type region is formed by fabrication process steps used to form other elements in the integrated circuit (100). In yet another embodiment, the p-type region is formed by fabrication process steps used to form source and drain regions for PMOS transistors in the integrated circuit (100). Depletion regions (112) form around the p-type regions (110). This is advantageous because the depletion regions remove charge generated by sites (108) and thus reduce current through the Schottky diode when it is operated in reverse bias. Metal silicide is prevented from forming in a surface region of the p-type region by the silicide block dielectric (104), causing the p-type region to be uncontacted by subsequently formed interconnect contacts; the attribute of being uncontacted by interconnects is known as floating.

Still referring to FIG. 1, CoSi2 is also formed in a region (114) in an n-type region in the cathode region (102) with higher n-type doping (116) than the n-type cathode region (102), defined by an opening in the dielectric layer (104). The CoSi2 region (114) contacting an n-type region with higher n-type doping (116) than the n-type region (102) forms an electrical connection to the cathode (102). A metal contact (118) is formed contacting the Schottky diode anode (106) and a metal contact (120) is formed contacting the CoSi2 region (114) connecting to the Schottky diode cathode, for the purpose of connecting the Schottky diode to electrical circuits in the integrated circuit (100).

Figure 2B:
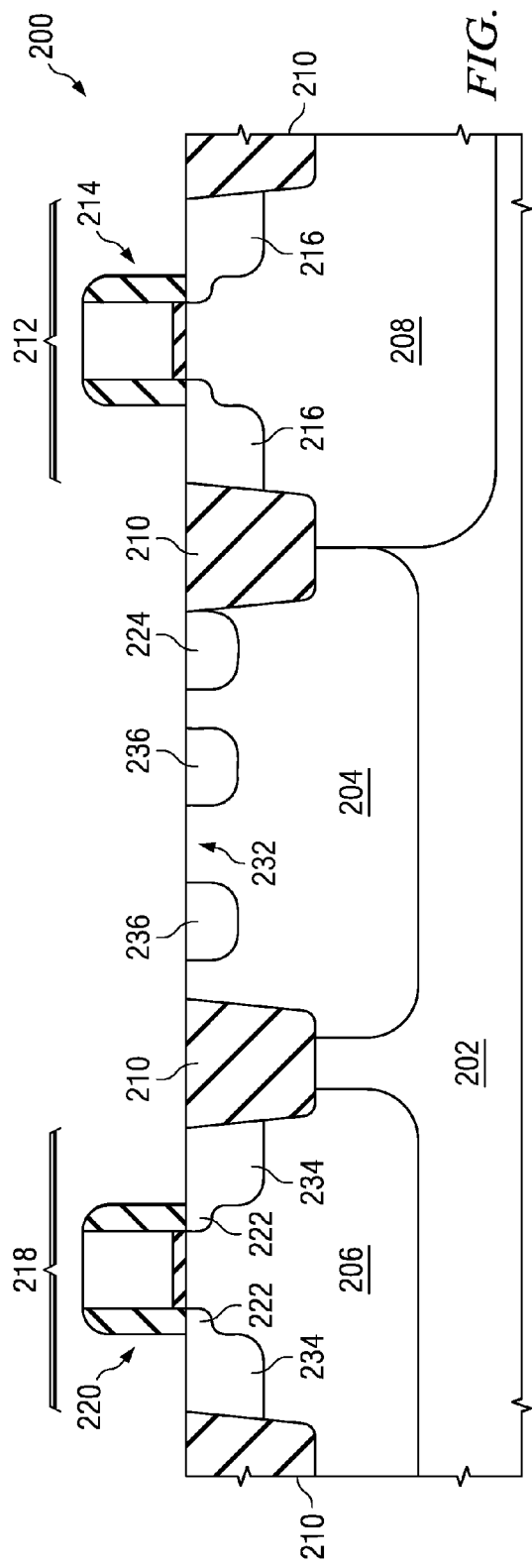
FIGS. 2A and 2B are fragmentary, diagrammatic sectional views on an enlarged scale of a Schottky diode embodying this invention, implemented on an integrated circuit containing MOS transistors, during a p-type dopant implant operation of a fabrication process.
Figure 2A:
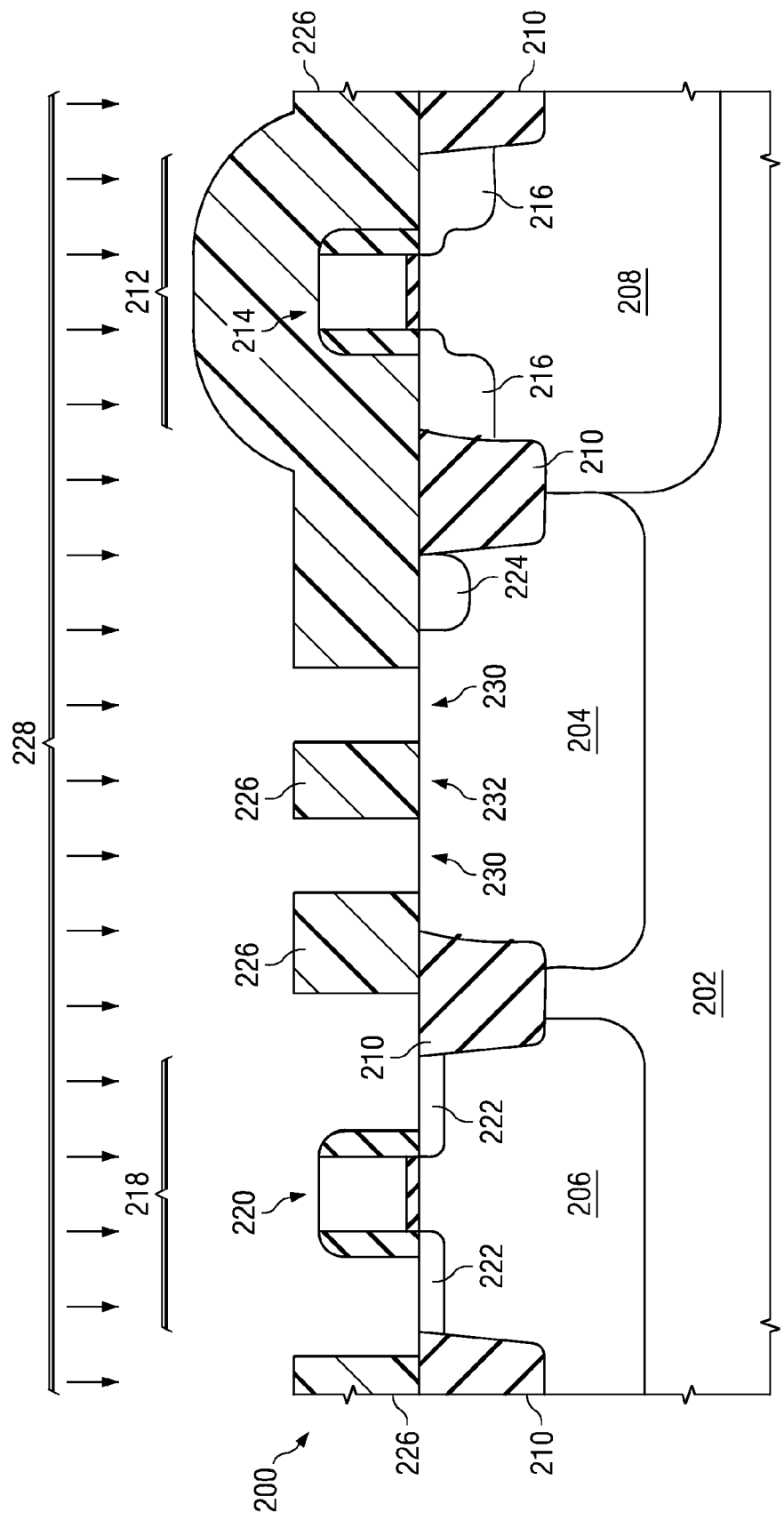

FIGS. 2A and 2B are fragmentary, diagrammatic sectional views on an enlarged scale of a Schottky diode embodying this invention, implemented on an integrated circuit containing MOS transistors, during a p-type dopant implant operation of a fabrication process. Integrated circuit (200) comprises a substrate (202), in which are formed an n-type cathode region (204), an n-type region known as a n-well (206), and a p-type region known as a p-well (208). Regions in the integrated circuit (200) are isolated by field oxide (210), typically comprising silicon dioxide, and formed by local oxidation of silicon (LOCOS) or shallow trench isolation (STI). A partially formed NMOS transistor (212), comprising gate structure (214) and source and drain regions (216), is formed in p-well (208). Similarly, a partially formed PMOS transistor (218), comprising gate structure (220) and partially formed source and drain regions (222), is fabricated in n-well (206). An n-type region (224) is formed in the n-type cathode region (204) wherein a doping density in the n-type region (224) is higher than in the n-type cathode region (204).

Referring to FIG. 2A, regions for implanting a p-type dopant species are defined by a photoresist layer (226) generated by known photolithographic techniques. A p-type dopant species (228) is implanted using known techniques into open regions in the photoresist (224), including gate structure (220) and source and drain regions (222) of the PMOS transistor (218) and a region (230) encircling a region (232) in which will be formed an anode of a Schottky diode in an embodiment of the instant invention in subsequent fabrication operations.

Referring to FIG. 2B, implanted p-type dopant species forms a p-type region (236) encircling a region (230) in which will be formed an anode of a Schottky diode in an embodiment of the instant invention in subsequent fabrication operations, as discussed above. In an embodiment of the instant invention, implanted p-type dopant species also forms source and drain regions (234) of the PMOS transistor (218).

Figure 3A:
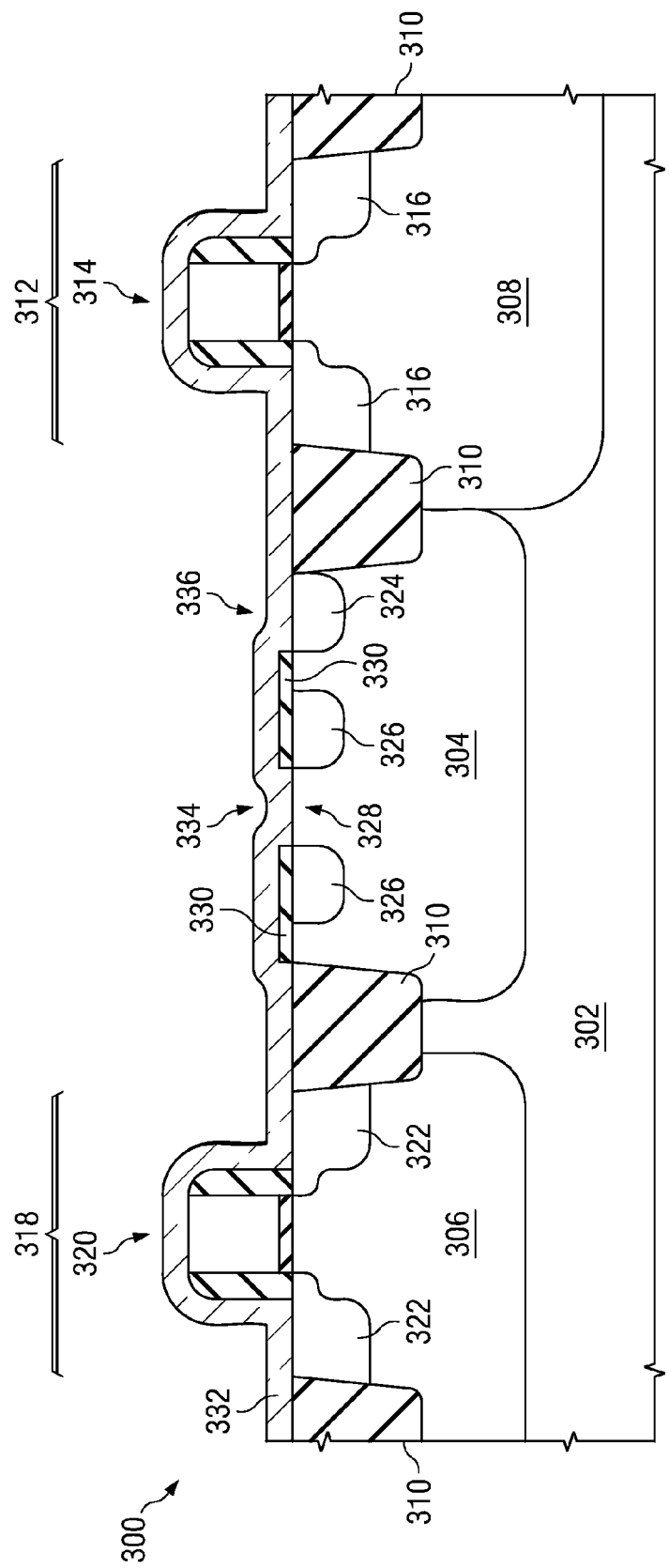
FIGS. 3A and 3B are fragmentary, diagrammatic sectional views on an enlarged scale of a Schottky diode embodying this invention, implemented on an integrated circuit containing MOS transistors, during a metal silicide formation operation of a fabrication process.
Figure 3B:
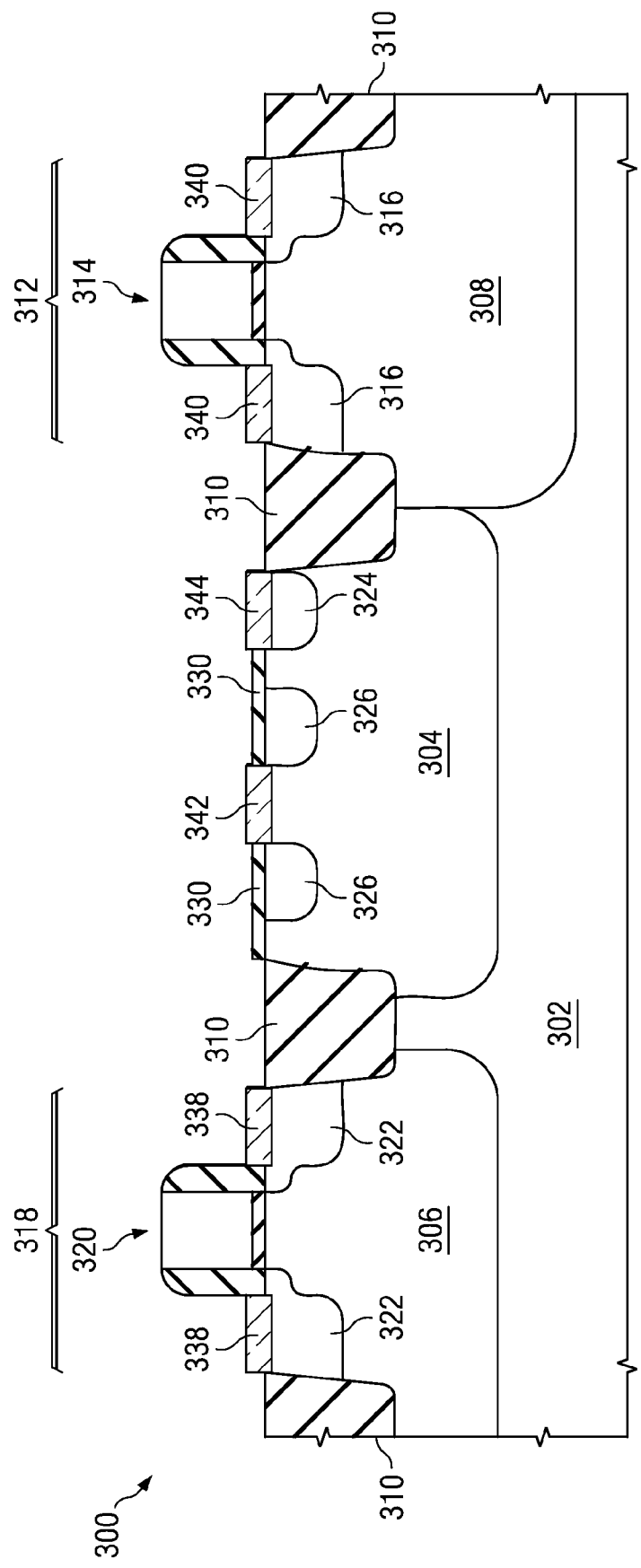

FIGS. 3A and 3B are fragmentary, diagrammatic sectional views on an enlarged scale of a Schottky diode embodying this invention, implemented on an integrated circuit containing MOS transistors, during a metal silicide formation operation of a fabrication process. Integrated circuit (300) comprises a substrate (302), in which are formed an n-type cathode region (304), an n-type region known as a n-well (306), and a p-type region known as a p-well (308). Regions in the integrated circuit (300) are isolated by field oxide (310), typically comprising silicon dioxide, and formed by local oxidation of silicon (LOCOS) or shallow trench isolation (STI). A partially formed NMOS transistor (312), comprising gate structure (314) and source and drain regions (316), is formed in p-well (308). Similarly, a partially formed PMOS transistor (318), comprising gate structure (320) and partially formed source and drain regions (322), is fabricated in n-well (306). An n-type region (324) is formed in the n-type cathode region (304) wherein a doping density in the n-type region (324) is higher than in the n-type cathode region (204). A p-type region (326) has been formed to encircle a region (328) in which will be formed an anode of a Schottky diode in an embodiment of the instant invention in subsequent fabrication operations.

Referring to FIG. 3A, a p-type region (326) has been formed to encircle a region (328) in which will be formed an anode of a Schottky diode in an embodiment of the instant invention in subsequent fabrication operations. A silicide block dielectric layer (330) has been formed on a top surface of the integrated circuit (300) and patterned, using known photolithographic and etching techniques, to define regions on a surface of the n-type cathode region (304) in which metal silicide will be prevented from forming. A silicide formation layer (332) of materials typically including cobalt is deposited a top surface of the integrated circuit (300), in preparation for forming metal silicide in regions wherein silicide formation layer (332) contacts silicon, for example in the gate, source and drain regions of transistors, in the anode regions (334) of Schottky diodes, in contact regions (336) in n-type cathode regions, and in contact regions in n-wells and p-wells. In regions wherein silicide formation layer (332) makes direct contact with silicon in a top surface layer of integrated circuit (300), metal silicide is formed. After formation of metal silicide, unwanted residue of silicide formation layer (332) is removed.

Referring to FIG. 3B, metal silicide, typically CoSi2, has been formed in source and drain regions (338) of PMOS transistors, in source and drain regions (340) of NMOS transistors, in the anode (342) of a Schottky diode, and in the contact (344) in the more heavily doped n-type cathode region connection region (324). It is important to note that metal silicide is not formed in contact with the p-type region (326) encircling the anode (342) of the Schottky diode.

Figure 4:
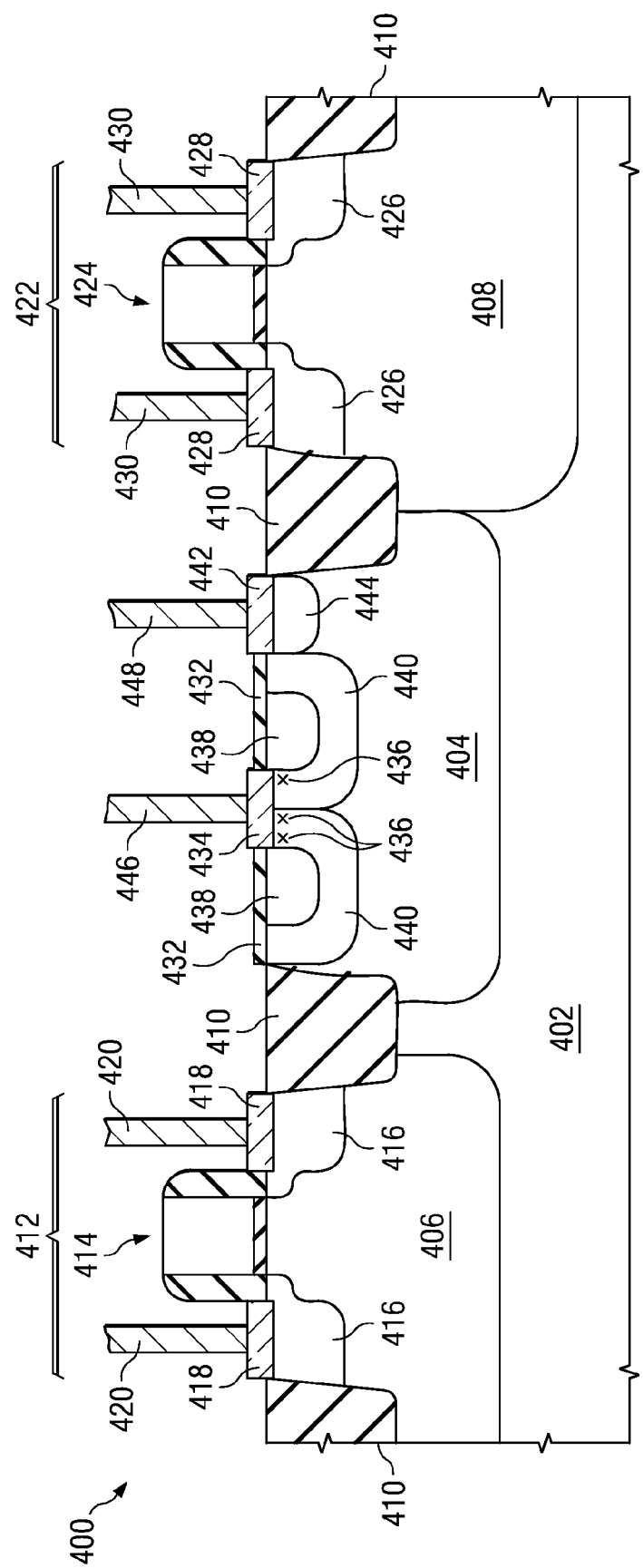
FIG. 4 is a fragmentary, diagrammatic sectional view on an enlarged scale of an integrated circuit diode comprising a single anode, a single cathode and a p-type region encircling the anode according to an embodiment of the instant invention, implemented on an integrated circuit containing NMOS and PMOS transistors.

FIG. 4 is a fragmentary, diagrammatic sectional view on an enlarged scale of an integrated circuit diode comprising a single anode, a single cathode and a p-type region encircling the anode according to an embodiment of the instant invention, implemented on an integrated circuit containing NMOS and PMOS transistors. An integrated circuit (400) provides a substrate (402) which contains an n-type cathode region (404), n-well (406) and p-well (408). Regions in the integrated circuit (400) are isolated by field oxide (410), typically comprising silicon dioxide, and formed by local oxidation of silicon (LOCOS) or shallow trench isolation (STI). A PMOS transistor (412), comprising a gate structure (414), source and drain regions (416), metal silicide regions (418) in the source and drain regions, and contact vias (420) to the metal silicide regions, is formed in the n-well (406). Similarly, an NMOS transistor (422), comprising a gate structure (424), source and drain regions (426), metal silicide regions (428) in the source and drain regions, and contact vias (430) to the metal silicide regions, is formed in the p-well (408). A silicide block dielectric layer (432), typically comprising silicon nitride, is formed on a surface of the n-type cathode region (404), and patterned to define regions for metal silicide formation in a later process step. A Schottky diode of this invention is fabricated in the integrated circuit (400) by forming a cobalt silicide (CoSi2) region (434) in a region of the n-type cathode region (404) defined by an opening in the silicide block dielectric layer (432). The CoSi2 region (434) comprises an anode of the integrated circuit diode of this invention, and the n-type region adjacent to the CoSi2 region comprises a cathode of the diode. Forming CoSi2 in the anode region generates sites (436) in the cathode region that generate leakage current when the diode is operated in reverse bias. In an embodiment of this invention, a p-type region (438) is formed in the integrated circuit substrate to encircle the anode. In another embodiment, the p-type region is formed by fabrication process steps used to form other elements in the integrated circuit (400). In yet another embodiment, the p-type region is formed by fabrication process steps used to form source and drain regions for a PMOS transistor (412) in the integrated circuit (400). Depletion regions (440) form around the p-type region (438). As discussed above, this is advantageous because the depletion regions remove charge generated by sites (436) and thus reduces current through the Schottky diode when it is operated in reverse bias. Metal silicide is prevented from forming in a surface region of the p-type region by the silicide block dielectric (432), causing the p-type region to be floating. CoSi2 is also formed in a region (442) in an n-type region (444) in the cathode region (404) with higher n-type doping than the n-type cathode region (404), defined by an opening in the silicide block dielectric layer (432). The CoSi2 region (442) contacting an n-type region with higher n-type doping (444) than the n-type cathode region (404) forms an electrical connection to the n-type cathode region (404). A metal contact (446) is formed contacting the Schottky diode anode (434) and a metal contact (448) is formed contacting the CoSi2 region (442) connecting to the Schottky diode cathode, for the purpose of connecting the Schottky diode to electrical circuits in the integrated circuit (400).

Figure 5:
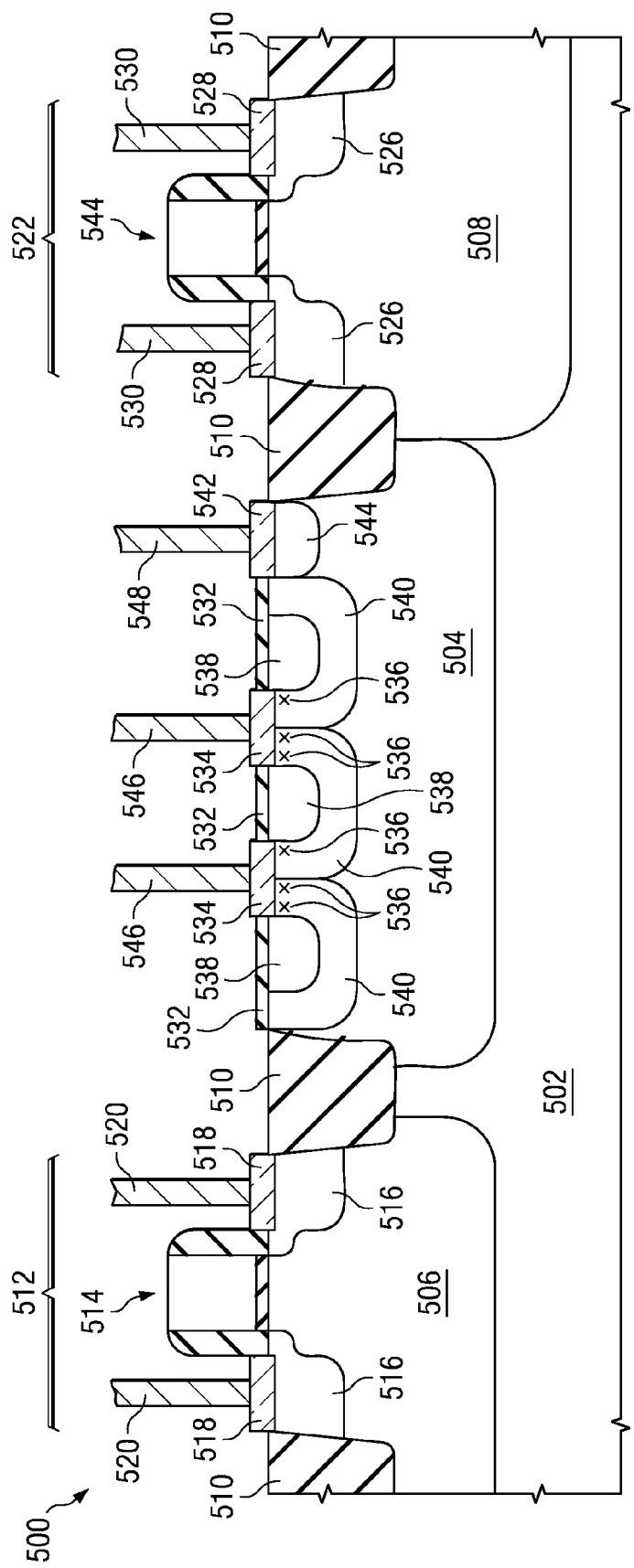
FIG. 5 is a fragmentary, diagrammatic sectional view on an enlarged scale of an integrated circuit diode comprising a plurality of anodes, a single cathode and a p-type region encircling the anodes according to an embodiment of the instant invention, implemented on an integrated circuit containing NMOS and PMOS transistors.

FIG. 5 is a fragmentary, diagrammatic sectional view on an enlarged scale of an integrated circuit diode comprising a plurality of anodes, a single cathode and a p-type region encircling the anodes according to an embodiment of the instant invention, implemented on an integrated circuit containing NMOS and PMOS transistors. An integrated circuit (500) provides a substrate (502) which contains an n-type cathode region (504), n-well (506) and p-well (508). Regions in the integrated circuit (500) are isolated by field oxide (510), typically comprising silicon dioxide, and formed by local oxidation of silicon (LOCOS) or shallow trench isolation (STI). A PMOS transistor (512), comprising a gate structure (514), source and drain regions (516), metal silicide regions (518) in the source and drain regions, and contact vias (520) to the metal silicide regions, is formed in the n-well (506). Similarly, an NMOS transistor (522), comprising a gate structure (524), source and drain regions (526), metal silicide regions (528) in the source and drain regions, and contact vias (530) to the metal silicide regions, is formed in the p-well (508). A silicide block dielectric layer (532), typically comprising silicon nitride, is formed on a surface of the n-type cathode region (504), and patterned to define regions for metal silicide formation in a later process step. A Schottky diode of this invention is fabricated in the integrated circuit (500) by forming a plurality of cobalt silicide (CoSi2) regions (534) in a region of the n-type cathode region (504) defined by an opening in the silicide block dielectric layer (532). The CoSi2 regions (534) comprise anodes of the integrated circuit diode of this invention, and the n-type region adjacent to the CoSi2 regions comprises a cathode of the diode. Forming CoSi2 in the anode region generates sites (536) in the cathode region that generate leakage current when the diode is operated in reverse bias. In an embodiment of this invention, a p-type region (538) is formed in the integrated circuit substrate to encircle the anode. In another embodiment, the p-type region is formed by fabrication process steps used to form other elements in the integrated circuit (500). In yet another embodiment, the p-type region is formed by fabrication process steps used to form source and drain regions for a PMOS transistor (512) in the integrated circuit (500). Depletion regions (540) form around the p-type region (538). As discussed above, this is advantageous because the depletion regions remove charge generated by sites (536) and thus reduces current through the Schottky diode when it is operated in reverse bias. Metal silicide is prevented from forming in a surface region of the p-type region by the silicide block dielectric (532), causing the p-type region to be floating. CoSi2 is also formed in a region (542) in an n-type region (544) in the cathode region (504) with higher n-type doping than the n-type cathode region (504), defined by an opening in the silicide block dielectric layer (532). The CoSi2 region (542) contacting an n-type region with higher n-type doping (544) than the n-type cathode region (504) forms an electrical connection to the n-type cathode region (504). Metal contacts (546) are formed contacting the Schottky diode anodes (534) and a metal contact (548) is formed contacting the CoSi2 region (542) connecting to the Schottky diode cathode, for the purpose of connecting the Schottky diode to electrical circuits in the integrated circuit (500).

What is claimed is:

1. A method of forming an integrated circuit, comprising:
providing a semiconductor substrate;
forming an n-well region and an n-type cathode region in the semiconductor substrate;
forming a gate dielectric over the n-well region;
forming a patterned gate electrode over the gate dielectric;
simultaneously forming p-type source and drain regions of a PMOS transistor in the n-well region adjacent the patterned gate electrode and a p-type floating region in the n-type cathode region; and
simultaneously forming silicide regions in the p-type source and drain regions and a silicide anode region in the n-type cathode region, wherein the silicide anode region is enclosed by the p-type floating region.

2. The method of claim 1, further comprising forming a silicide blocking layer over the p-type floating region.

3. The method of claim 2, wherein the silicide regions and the silicide anode region comprise cobalt silicide.

4. The method of claim 2, wherein the silicide regions and the silicide anode region comprise nickel silicide.

5. The method of claim 1, wherein the n-well region and the n-type cathode region formed as a contiguous region.

6. The method of claim 1, further comprising:
forming a p-well region in the semiconductor substrate;
forming a gate dielectric over the p-well region;
forming a patterned gate electrode over the gate dielectric in the p-well region;
forming n-type source and drain regions in the p-well region adjacent the patterned gate electrode; and
simultaneously forming silicide regions in the n-type source and drain regions with forming the silicide regions in the p-type source and drain regions.

7. The method of claim 6, further comprising forming a silicide blocking layer over the p-type floating region.

8. The method of claim 7, wherein the silicide regions comprise cobalt silicide.

9. The method of claim 6 wherein the silicide regions comprise nickel silicide.

10. A method of fabricating an integrated circuit, comprising:
forming an n-type region in a semiconductor substrate;
forming a silicide block layer over the n-type region;
patterning the silicide block layer to define regions for metal silicide formation;
fabricating a diode by forming a first cobalt silicide region in a portion of the n-type region defined by a first opening in the silicide block layer, the first cobalt silicide region defining an anode and parts of the n-type region adjacent to the cobalt silicide region defining a cathode;
forming a p-type region in the semiconductor substrate to encircle the anode, the p-type region being formed by fabrication processing steps that simultaneously form source and drain regions for PMOS transistors in the semiconductor substrate, and the formation of the p-type region causing the formation of depletion regions around the p-type region which remove charge from sites in the cathode that generate leakage current when the diode is operated in reverse bias; the formation of metal silicide in a surface region of the p-type region being prevented by the silicide block layer;
forming a higher doped region in the n-type region, the higher doped region having a higher n-type doping than the n-type region;
forming a second cobalt silicide region in a portion of the higher doped region defined by a second opening in the silicide blocking layer, thereby forming an electrical connection to the cathode;
forming interconnects, including an anode contact to the first cobalt silicide region and a cathode contact to the second cobalt silicide region; the p-type region being left uncontacted by the interconnects.

11. A method of fabricating an integrated circuit, comprising:

forming an n-type cathode region, an PMOS transistor n-type well region, and an NMOS transistor p-type well region isolated by oxide in a semiconductor substrate;

forming PMOS and NMOS gate structures respectively over the n-type well region and p-type well region;

simultaneously forming p-type source and drain regions in the n-type well region adjacent the PMOS transistor gate structure and a p-type region encircling an anode receiving portion of the n-type cathode region;

forming n-type source and drain regions in the p-type well region adjacent the NMOS transistor gate structure;

forming a higher doped n-type region in the n-type cathode region, the higher doped n-type region having a higher n-type doping than the n-type cathode region;

forming a silicide block layer over at least the n-type cathode region, including over the p-type region encircling the anode receiving portion;

patterning the silicide block layer to define first and second openings respectively over the anode receiving portion and the higher doped n-type region;

fabricating a diode by forming a first cobalt silicide region in a first portion of the n-type cathode region defined by the first opening and by forming a second cobalt silicide region in a second portion of the n-type cathode region defined by the second opening, the first cobalt silicide region defining an anode, parts of the n-type region adjacent to the first cobalt silicide region defining a cathode, and the second cobalt silicide region defining an electrical connection to the cathode; and forming interconnects, including an anode contact to the first cobalt silicide region and a cathode contact to the second cobalt silicide region; the p-type region encircling the anode receiving portion being left uncontacted by the interconnects.

12. The method of claim 11, wherein the first and second cobalt silicide regions are formed simultaneously with formation of silicide regions in at least one of the PMOS or NMOS source and drain regions or gate structures.

13. The method of claim 12, wherein forming the p-type region encircling the anode receiving portion of the n-type cathode region comprises forming multiple p-type regions respectively encircling multiple anode receiving portions of the n-type cathode region; patterning the silicide block layer comprises patterning the silicide block layer to define multiple first openings respectively over the multiple anode receiving portions; forming the first cobalt silicide region comprises forming multiple first cobalt silicide regions in respective multiple first portions of the n-type region defined by the multiple first openings; and forming an anode contact to the first cobalt silicide region comprises forming multiple anode contacts to the respective multiple first cobalt silicide regions.

* * * * *